United States Patent
Momtaz

[19]

[11] Patent Number: 5,933,037
[45] Date of Patent: Aug. 3, 1999

[54] HIGH SPEED PHASE LOCK LOOP HAVING CONSTANT BANDWIDTH

[75] Inventor: Afshin D. Momtaz, Irvine, Calif.

[73] Assignee: Adaptec, Inc., Milpitas, Calif.

[21] Appl. No.: 08/924,009

[22] Filed: Aug. 29, 1997

[51] Int. Cl.⁶ ....................................... H03L 7/06
[52] U.S. Cl. ............ 327/157; 331/25; 331/DIG. 2; 375/376
[58] Field of Search .................... 327/156, 157, 327/2, 3, 5, 7; 331/17, 25, DIG. 2; 375/374, 376

[56] References Cited

U.S. PATENT DOCUMENTS

| | | | |
|---|---|---|---|
| 5,144,156 | 9/1992 | Kawasaki | 327/157 |
| 5,166,641 | 11/1992 | Davis | 331/1 A |
| 5,675,292 | 10/1997 | McCune | 331/17 |
| 5,703,511 | 12/1997 | Okamoto | 327/157 |
| 5,727,037 | 3/1998 | Maneatis | 375/376 |

*Primary Examiner*—Kenneth B. Wells
*Assistant Examiner*—Hai L. Nguyen
*Attorney, Agent, or Firm*—Christie, Parker & Hale, LLP

[57] ABSTRACT

A phase lock loop includes precision charge pump current generation circuit which provides a dynamically variable charge pump current to a charge pump. The charge pump current is developed from the VCO control voltage and varies in inverse proportionality to changes in the control voltage. The proportionality between the precision current and the control voltage is defined by a bias network and such that the current is inversely proportional to the VCO gain and the phase lock loop bandwidth is therefore maintained at a substantially constant value.

17 Claims, 4 Drawing Sheets

HIGH SPEED PHASE LOCK LOOP HAVING CONSTANT BANDWIDTH

RELATED APPLICATIONS

This application is related to co-pending applications entitled High Speed Phase Lock Loop Having High Precision Charge Pump with Error Cancellation, and Gigahertz Transceiver Phase Lock Loop Having Autofrequency Lock Correction, both filed on instant date herewith and commonly owned by the Assignee of the present invention, the entire disclosures of which are expressly incorporated herein by reference.

FIELD OF THE INVENTION

The present invention is directed to high speed data transmission and conversion systems and, more particularly, to a system for and a method of controlling the bandwidth of a high speed phase lock loop to a constant value to ensure synchronization of an asynchronous data stream over varying environmental conditions.

BACKGROUND OF THE INVENTION

The past few years have seen a dramatic increase in the speed of data transmission between various components of a computer system or between multiple computer systems connected together in a network. Indeed, since general acceptance of personal computer systems in the 1960's, data transmission speeds have grown with an almost power law dependence; about 1 MHz in the '60's, 10 MHz in the '70's, 100 MHz in the '80's, and 1 GHz speeds being routinely achieved in the '90's.

Optical fibre is a particular enabling technology for modern day 1 GHz data transmission speeds and, in the computer industry, has given rise to a data transfer protocol and interface system termed Fibre-Channel. Fibre-Channel technology involves coupling various computer systems together with optical fibre or a fibre channel-type electrically conductive (copper) cable and allows extremely rapid data transmission speeds between machines separated by relatively great distances. However, because of the physical characteristics of fibre channel-type cable, present day systems are only capable of serial-fashion data transmission (at least when only a single optical fibre or electrical cable is used to interconnect various computer systems). However, computer systems are constructed to almost universally handle data in parallel fashion on byte-multiple signal busses (8-bit, 16-bit or 32-bit busses), making it incumbent on any data transmission system to provide some means for converting a 1 GHz serial data stream into a byte or byte-multiple parallel data stream. Conversely, since the fibre channel protocol is 2-way, computer systems that typically operate with parallel data structures, must have some means for serializing a byte or byte-multiple data stream into a 1 GHz data signal suitable for transmission down an optical fibre or electrically conductive (copper) cable.

Parallel data being serialized for high speed transmission, is typically synchronous, in that the sequence of 1's and 0's making up the resulting serial data stream occurs with reference to a uniform or single-frequency serializer clock signal. Encoding and transmitting the clock signal, together with the data, would take up inordinate amounts of valuable signal bandwidth and reduce the overall data transmission speed of a fibre channel system. Even though some small degree of self-clocking is inherent in the serial data stream, some method of evaluating the data stream must be used in order that a transceiver or serial-to-parallel data recovery system may determine how to appropriately frame the binary data stream into bytes.

In many applications, this function is performed by various types of data synchronizers, which generate or regenerate a synchronous timing reference signal from a serial data stream and provides the timing reference to a serial-to-parallel converter, such as a sequential latch. In effect, a data synchronizer generates a synchronous stream of successive timing references, each timing reference representing a bit cell with which a data bit is associated. For example, 10 consecutive timing references might represent an 8-bit data word followed by 2 bits of error correction code which might then be latched out onto a 10-bit parallel data bus by a, for example, 10-bit counter. The data synchronizer, accordingly, is an essential component in modern day gigahertz serial to parallel data converters.

However, the frequency of clock signals synthesized by such circuitry is subject to a number of variations introduced by the electronic components of such systems. Typically, the electronic components in the data path introduce elements of phase and frequency noise which are random in nature and, more particularly, have dramatically varying bandwidth characteristics depending on the geometric and electronic variations in modern semiconductor manufacturing process parameters. A synchronizer, such as a 1.06 GHz to 106 MHz Transceiver, must take these variations into account when attempting to deal with a 1.06 GHz serial data stream. Implementations of such a synchronizer or transceiver, typically include at least phase-locked loop (PLL), normally comprising a phase or phase and frequency detector, a charge pump, an analog filter, and means for generating a synchronous clock signal, such as a voltage controlled oscillator (VCO). When receiving data, during what is conventionally termed frequency or velocity lock, the oscillation frequency of the VCO is determined by, and locked to the frequency of an external clock provided for such purpose, just prior to receiving the serial data stream. Once frequency or velocity lock is established, the VCO runs in what might be termed a quasi-flywheel mode at a mean frequency determined during velocity lock. Subsequent correction control to the VCO frequency is developed by phase-locking a transition edge of the synchronous VCO signal to a transition edge of an incoming data signal. The VCO is phase-locked to the incoming serial data stream by comparing, the phase of the rising edge of the VCO clock signal to the phase of the rising edge of a data One (1) bit, in a phase detector. A phase or time difference detected between the two rising edges causes a charge pump to generate a control voltage, directing the VCO to either speed up or slow down in response to frequency variation in the data stream.

An analog low pass filter is typically provided between the charge pump and the VCO to reject corrections resulting from random high-frequency variations of individual data bits, and allow ideally only corrections resulting from consistent frequency shifts of the data stream. The VCO is therefore locked to the mean phase of the data stream, rather than to the phase of a particular data bit. Once phase-locked, the synchronous VCO signal provides for a recovered clock signal whose rate (frequency) is equal to the data bit rate or an integral multiple thereof.

The typical prior art phase-locked loop system is illustrated in FIG. 1, and is connected to receive an incoming serial data stream from, for example, an optical fibre cable 10. The phase-locked loop suitably comprises a phase detector 11, coupled to a charge pump 12, an analog filter 13, and a voltage controlled oscillator or VCO 14.

Serial data is directed over the, for example, optical cable 10 to an input of the phase detector 11, in which its phase is compared to the phase of the output signal of the VCO 14. The output of the phase detector 11 comprises 2 signals, pump-up (or UP) 16 and pump-down (or DN) 18 which, in turn, direct the charge pump 12 to apply a source or sync current to the analog filter 13 which develops a voltage control signal for the VCO 14. Conventionally, the pulse detector 11 issues UP 16 if the data stream leads the VCO signal, and issues DN 18 if the serial data stream phase lags the signal stream from the VCO 14. UP 16 and DN 18 are directed to the charge pump 12 which sources or sinks a particular amount of current (denoted herein $I_{CP}$) to or from, respectively, the filter 13. The filter 13 includes at least a resistor across which a voltage is developed as the charge pump current $I_{CP}$ is sourced or sunk to or from a capacitor in well known fashion, causing controlled changes to the VCO control voltage ($V_C$). The sign of the VCO control voltage variation depends on whether the phase of the data stream leads or lags the phase of the VCO output, and its magnitude is a function of the extent of the lead or lag. Thus, the output frequency of the VCO 14 is increased or decreased, as appropriate, to reduce the lead or lag at the inputs to the phase detector 11. The phase-locked loop thus ensures that the VCO output, which may be used as a timing reference, is locked in phase with the incoming serial data stream.

The primary shortcoming of prior art phase-locked loop systems is that their response times and stability characteristics depend on bandwidth. For example, PLL bandwidth is directly proportional to time-to-lock, i.e., the time it takes for a PLL to establish a stable frequency or velocity lock to an external clock. In addition, PLL bandwidth has a direct effect on the stability of a PLL system. A VCO output signal is generally regular and periodic, whereas the occurrence of a data bit in a serial data stream is irregular. With inadequate bandwidth, this may lead to a run away correction condition, as the charge pump constantly attempts to correct for irregular phase lags or phase leads.

PLL bandwidth is generally recognized as being a function of the charge pump current ($I_{CP}$) the analog filters' resistor (denoted herein as $R_1$) and the gain of the VCO (denoted as $K_{VCO}$), and is given by the expression:

$$\Omega_0 = R_1 I_{CP} K_{VCO}$$

Power supply voltage fluctuations, circuit temperature variations and manufacturing process parameter drift all combine to vary the filter resistance, charge pump current and VCO gain, thus distorting the PLL's bandwidth characteristic, making it less-than-ideal. This bandwidth distortion has significant implications for high-speed, low error rate, fibre channel data transmission systems.

Certain attempts have been made in recent years to design PLL's for bandwidth stability using the specified centers of a specific set of manufacturing process parameters. Such designs function adequately if the manufacturing process parameter tolerance range does not vary more than approximately 1 sigma ($\sigma$) from the parameter centers. If, however, the process tolerances are within specification, but at the tolerance corners, PLL bandwidth is often seen to vary according to a 1 to 8 ratio (approximately 0.5 to approximately 4.0 MHz). The time-to-lock is decreased in a manner directly proportional to the decrease in bandwidth as is the degree of over damping or under damping and stability.

Accordingly, there is a demonstrated need for a phase lock loop system in which bandwidth is maintained at a relatively constant value regardless of power supply voltage fluctuations, temperature variations and manufacturing process parameter drift. Such a PLL will be able to demonstrate a generally constant bandwidth characteristic during changing environmental conditions such as during circuit initialization operations, and initial velocity lock after a significant period of down-time.

SUMMARY OF THE INVENTION

There is provided in accordance with one aspect of the present invention, a precision charge pump generation circuit for defining a characteristic charge pump current sourced to and sunk from a filter capacitor in order to develop a control voltage for a voltage controlled oscillator. The precision charge pump generation circuit is connected to and operatively responsive to the oscillator control voltage and generates a precision characteristic current which is variable in inverse proportion to changes in the control voltage, such that the bandwidth of a phase lock loop is maintained in a substantially constant condition.

The precision charge pump generation circuit suitably comprises a bias voltage generation section which is connected to receive the oscillator control voltage at an input and which develops a variable bias voltage as a first order function of the control voltage. The generation circuit further comprises a variable current generator which is operatively responsive to the bias voltage. The variable current generator defines a characteristic current having a magnitude which is variable in inverse proportionality to the oscillator control voltage.

In particular, the variable current generator includes a current source, a resistor connected in series fashion to the current source and voltage bias means connected between the current source and the resistor for providing a variable bias voltage across the resistor so as to define the variable current therethrough. The voltage generator includes a bias network which defines a numerically determinable adjustment voltage which is additively combined to the oscillator control voltage to form the bias voltage. The bias voltage so defined is reflected to the current generator by a voltage follower comprising an operational amplifier connected to control the gate terminal in the N-channel transistor, configured as the source follower, the operational amplifier and transistor, in combination, maintaining the bias voltage across the resistor.

More particularly, the bias network defines a numerically determinable adjustment voltage such that when this voltage is additively combined with the oscillator control voltage, the resulting bias voltage varies in inverse proportionality to the voltage controlled oscillator gain. The numerically determinable adjustment voltage is so defined that the product of the VCO gain times the bias voltage is substantially constant.

In a further aspect of the present invention, a phase lock loop of the type adapted to provide a timing reference in the GHz range for synchronizing to an asynchronous serial data stream includes a precision charge pump generation circuit for defining a characteristic charge pump current which is sourced to and sunk from a filter capacitor, in combination with the first resistor, for developing a VCO control voltage. The characteristic current is dynamically variable in inverse proportionality to the oscillator gain such that the phase lock loop bandwidth is maintained at a substantially constant value.

BRIEF DESCRIPTION OF THE DRAWINGS

These and other features, aspects and advantages of the present invention will be more fully understood when considered with respect to the following detailed description, appended claims, and accompanying drawings; wherein:

DETAILED DESCRIPTION

Figure 2:
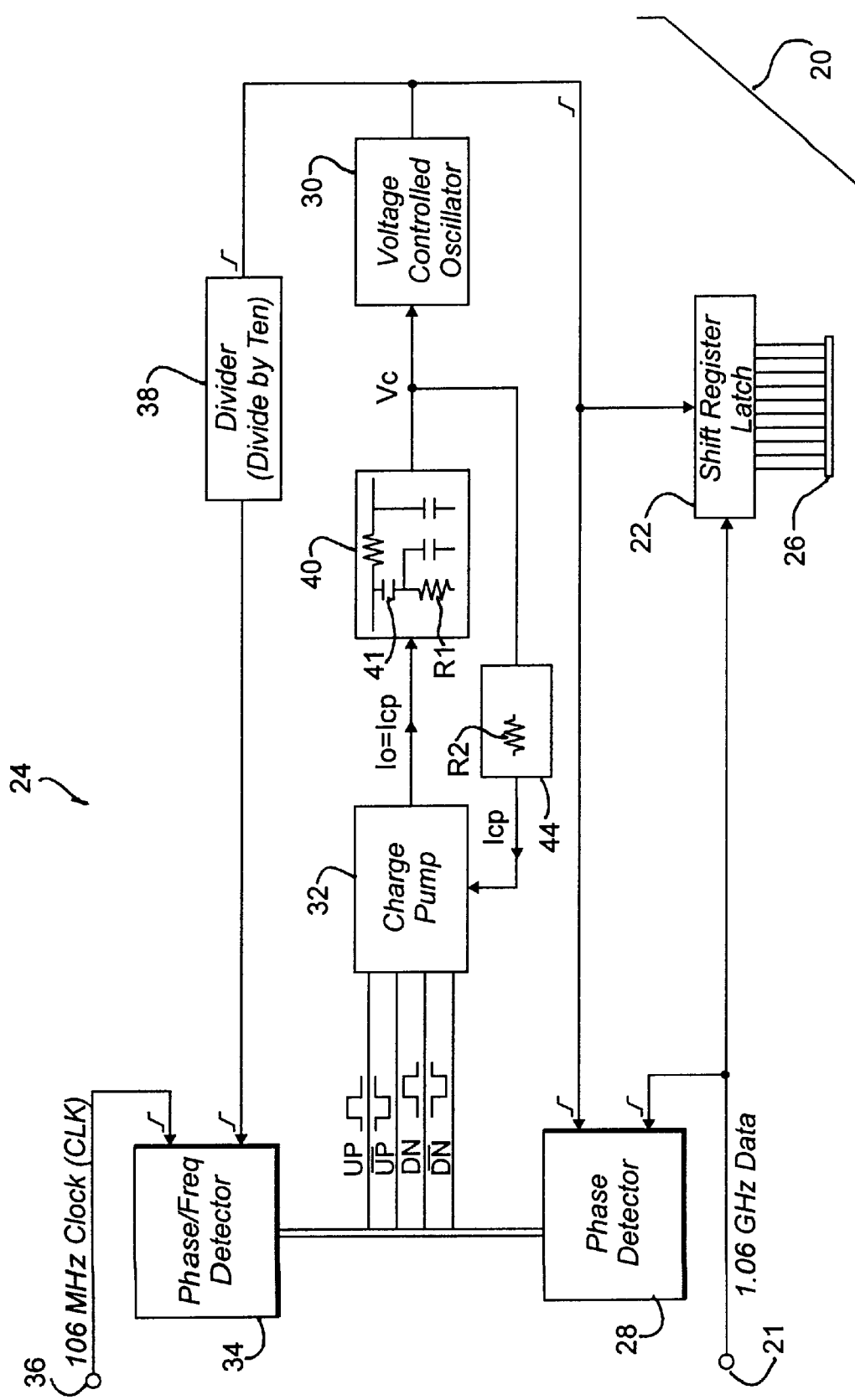
FIG. 2 is a semi-schematic simplified block diagram of a phase lock loop suitable for detecting and synchronizing approximately 1 GHz data signals and including a precision charge pump generator in accordance with the present invention.

Referring now to FIG. 2, there is depicted, in semi-schematic block diagram form, a generalized receiver circuit for converting an incoming serial data stream operating at 1.06 GHz, into 10-bit parallel data provided on a parallel data bus operating at data rates of about 106 MHz. The receiver circuit, generally indicated at 20, is connected an input 21 which receives 1.06 GHz serial data and is seen to comprise two main portions; a serial to parallel converter circuit 22 and a phase-locked loop (PLL) 24 which is configured to provide clock signals to the serial-to-parallel converter circuit 22. In the illustrated embodiment of FIG. 2, the serial-to-parallel converter 22 is depicted as a simple shift register and latch for purposes of illustration. It will be understood by those having skill in the art that the shift register and latch illustrated in FIG. 2 could easily be implemented as a de-serializer circuit in combination with a clock recovery section or some other such suitable means for converting serial data into parallel form. However, the shift register and latch 22 illustrated in FIG. 2 will serve to illustrate the function and purpose of the various signals comprising the generalized receiver circuit 20.

Incoming serial data is shifted into the circuit 22 in accordance with a 1.06 GHz shift-in clock signal corresponding to the output signal of a voltage controlled oscillator. Once all the positions of the shift register and latch 22 have been filled, the resulting 10-bit word (referred to in the fibre channel world as an encoded transmission character) is latched onto a parallel data bus 26. It will be recognized by one having skill in the art that the periodicity of a byte clock signal will necessarily depend on the width of the data bus 26 and will be equal to the incoming data frequency (1.06 GHz in the example of FIG. 2) divided by the bit width of the data bus (10-bits in the exemplary embodiment) requiring the byte clock (shift out signal) to have a frequency of approximately 1.06 MHz.

The foregoing description of the serial-to-parallel conversion system 22 has been set out as an aid to understanding the functioning of a PLL circuit 24 constructed in accordance with practice of principles of the invention. The serial-to-parallel converter 22 is thus merely exemplary, highly simplified, and is not intended to either define or limit the scope of the present invention. In addition, the absolute values of the incoming serial data stream, as well as the width of the parallel data bus 26 will be recognized as serving to provide only a context for understanding the construction and operation of the PLL 24 of the present invention. Accordingly, those skilled in the art of circuit design will recognize that the incoming serial data stream may occur at any frequency while the parallel data bus may be constructed with any bit-width without violating the scope of the present invention.

Figure 1:
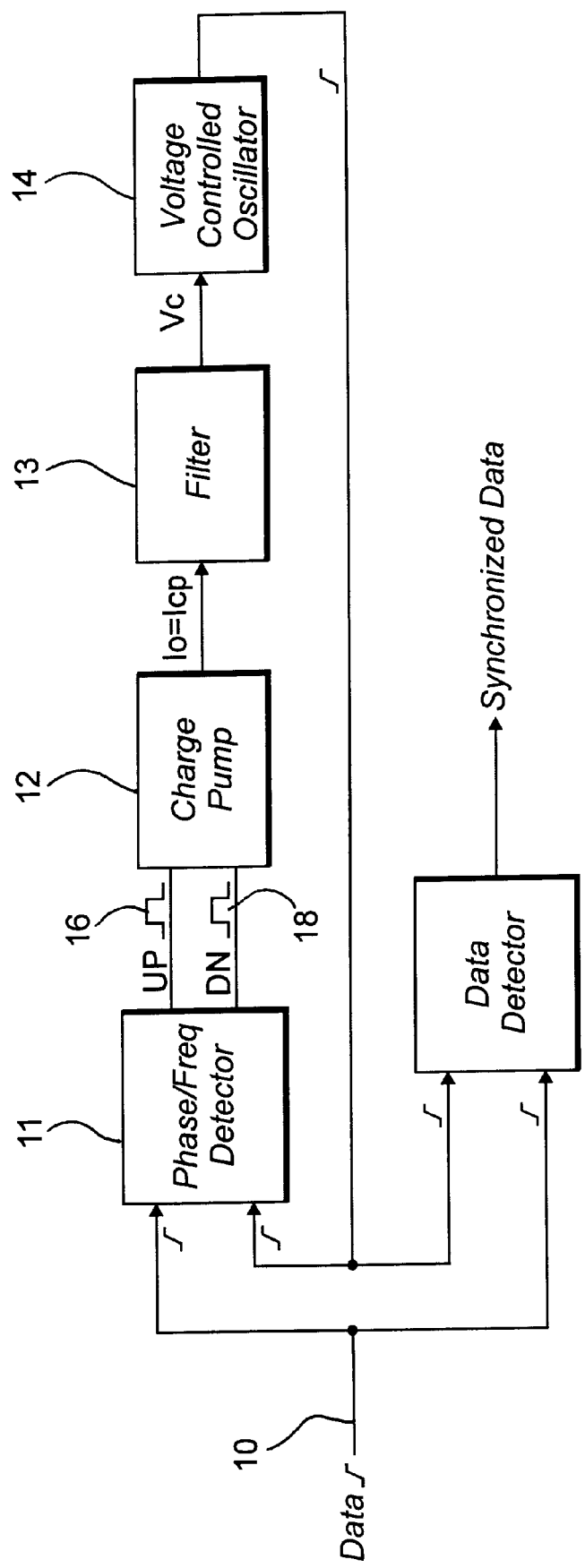
FIG. 1 is a semi-schematic simplified block diagram of a phase lock loop in accordance with the prior art.

In a manner similar to that described with reference to FIG. 1, an incoming serial data stream is received at a data input 21 and directed to a phase detector 28, wherein the rising edge of data bits comprising the serial data stream are compared in phase with the rising edges of a signal train provided by a voltage controlled oscillator (VCO) 30. Phase detector 28 may be constructed in accordance with a wide variety of well known techniques, and preferably comprises a Charlie Hogge-type phase detector, whose construction and operational parameters are well understood by those having skill in the art.

Briefly, the Charlie Hogge-type phase detector is operative to provide constant and spaced-apart UP and DN pulses to a charge pump regardless of the logical state of a particular data bit. This particular phase detector implementation scheme ensures that rising edges of a VCO signal, when compared to a data ZERO signal does not result in the PLL becoming unstable. In well known fashion, the Charlie Hogge-type phase detector comprises a logical NOR, such that both the rising edge of a data ONE signal and the rising edge of a VCO signal need to be present in order for the charge pump to truly perturb the system. In the absence of a data ONE or a VCO signal, the Charlie Hogge-type phase detector in effect operates the PLL in a "flywheel" configuration. In keeping with the implementation of phase detector 28, phase comparisons result in the production of four output signals from the phase detector, which are directed to a charge pump 32 which, in turn, causes a control voltage ($V_C$) to be generated which controls the oscillation frequency of the VCO 30, so as to maintain a stable phase relationship between the VCO signal train and the incoming serial data stream.

An additional detector, a phase and frequency detector 34 is also provided and connected in parallel-fashion with phase detector 28 to the charge pump 32. The phase and frequency detector 34 comprises a first input 36 which is connected to a stable, external clock operating, in the illustrated embodiment, at 106.25 MHz. Phase and frequency detector 34 includes a second input configured to receive the signal train output of the VCO 30 after being processed by a divide by ten counter (termed herein a VCO divider) 38.

During an initialization procedure, the PLL 24 is operated such that the VCO 30 is brought to a condition termed frequency or velocity lock by operation of the phase and frequency detector 34. A source of stable frequency, such as a controlled-crystal oscillator operating at a frequency of about 106.25 MHz, is supplied to the first input 36 of the detector 34 in which it is compared with the frequency or phase velocity of the VCO 30. The VCO divider 38 divides the frequency of the output of the VCO 30 by a specific value (10 in the embodiment of the present invention) and provides that divided value to the second input of detector 34. In the exemplary embodiment of FIG. 2, the VCO 30 is designed to operate at a frequency of about 1.06 GHz and thus, by dividing the VCO frequency by ten, the VCO divider 38 provides a signal train having a frequency of about 106 MHz to the second input of detector 34. This divided frequency is compared in phase with the frequency of a, for example, controlled-crystal oscillator, by the detector and the results of the phase comparison are provided as control signals to the charge pump 32 which, in turn, adjusts the VCO frequency by applying a control voltage $V_C$ through an analog filter 40.

The respective phase comparison outputs of both phase detector 28 and phase and frequency detector 34 are directed to the charge pump 32 and suitably comprise a pump-up signal, denoted UP, a pump-down signal, denoted DN, as well as the logical inverse of these two signals, denoted $\overline{UP}$ and $\overline{DN}$ respectively. In the charge pump 32, UP and DN cause a fixed amount of current (denoted herein as $I_{CP}$) to be sourced into or to be sunk from a capacitor circuit and across a resistor (denoted herein as $R_1$) to develop thereby a control voltage $V_C$ which controls the VCO 30. More particularly, UP directs the charge pump 32 to source current, while DN directs the charge pump 32 to sink current. $\overline{UP}$ and $\overline{DN}$ are identical signals to UP and DN, but are precisely 180 degrees out of phase therewith. The combination of UP, DN and their logical NOTs stabilizes operation of the charge pump 32 and allows $I_{CP}$ to be developed with greater precision. It should be noted that charge pump 32 may be implemented in conventional fashion, but preferably is constructed and follows operational principles defined in accordance with the charge pump disclosed in co-pending application entitled High Speed PLL Having High Precision Charge Pump with Error Cancellation, the entire disclosure of which is expressly incorporated herein by reference.

As mentioned above, the charge pump 32 operates to source or sink a charge pump current $I_{CP}$ to or from a capacitor through resistor $R_1$ of the analog filter 40 to thereby develop a control voltage $V_C$ which is directed to the VCO 30. Conventionally, $I_{CP}$ represents a fixed quanta of current which is sourced or sunk to or from the capacitor through the resistor $R_1$ whenever the UP or DN signals toggle. However, it is well understood phenomenon that the response bandwidth of a PLL such as PLL 24, will vary dramatically as a function of the magnitude of the charge pump current $I_{CP}$, the value of resistor $R_1$ and the gain of the voltage controlled oscillator $K_{VCO}$. Each of these quantities, particularly $I_{CP}$ and $R_1$ and, thus, $K_{VCO}$ will necessarily vary with power supply voltages, temperature, and silicon manufacturing process parameter tolerant draft. If the $\Omega_0$, $R_1$, $I_{CP}$ and $K_{VCO}$ denote PLL bandwidth, the filters' resistor, charge pump current and VCO gain respectively, then the bandwidth of PLL 24 may be expressed as follows:

$\Omega_0 = R_1 I_{CP} K_{VCO}$

Given that the foregoing expression is multiplicative, it will be understood that if the charge pump current $I_{CP}$ is made inversely proportional to the filter's resistor $R_1$ and the VCO gain $K_{VCO}$, then variations in resistance and VCO gain will be compensated by a generally opposite swing in the value of the charge pump current. Accordingly, the magnitude of PLL bandwidth swings may be substantially reduced. In addition, where charge pump current is generated from the VCO control voltage, $V_C$, it will be understood that VCO gain may be tracked thereby allowing $I_{CP}$ to be proportional thereto.

Specifically, the charge pump current $I_{CP}$ is developed by applying a voltage $V_B$ across a second resistor $R_2$ which results in the mathematical expression for $I_{CP}$ being equated to $V_B/R_2$ (by Ohm's law). Under this condition, the mathematical expression for bandwidth may be evaluated as $\Omega_0 = [R_1/R_2] V_B K_{VCO}$ In a manner which is well understood by those having skill in the art, the VCO gain ($K_{VCO}$) and VCO control voltage changes ($\delta V_C$) are approximately inversely proportional, such that the voltage difference $V_B$ applied across the second resistor $R_2$ may be defined as the quantity ($V_C - V_D$) where $V_C$ is the VCO control voltage and $V_D$ is a voltage value determined in a manner to be described in greater detail below. Because of the inverse proportionality between $K_{VCO}$ and $\delta V_C$, the quantity $K_{VCO} (V_C - V_D)$ will be understood to be relatively constant under substantially all conditions.

It is thus apparent that the expression for PLL bandwidth may be evaluated in accordance with the following equation:

$\Omega_0 = [R_1/R_2][K_{VCO}(V_C - V_D)]$.

It is apparent that PLL bandwidth may be viewed as a function of the ratios of 2 resistors, ($R_1$ and $R_2$) times the product of VCO gain and a voltage function which, in turn, depends on the VCO control voltage. Maintaining constancy of the PLL bandwidth, therefore, requires maintaining constancy of the two terms of the foregoing expression. As to the first expression, the ratio of the two resistors $R_1$ and $R_2$, constancy is maintained by constructing the resistors as a matched pair in accordance with well known semiconductor design and manufacturing techniques. Implementing the two resistors as a matched pair would involve putting them in close areal proximity to one another, implementing them in silicon from material having the same resistivity, and designing them to react equally to geometrical tolerance drift. Accordingly, each of the resistors $R_1$ and $R_2$ will drift in the same direction and with the same proportional magnitude under substantially all power supply voltage, temperature and silicon manufacturing process variations. When the two resistors are thus implemented as a ratio, all of the aforementioned parametric variations will cancel out, resulting in the ratio value remaining constant under all conditions.

As to the second term $[K_{VCO} (V_C - V_D)]$, and as discussed above, the voltage portion $(V_C - V_D)$ is made inversely proportional to the VCO gain $K_{VCO}$, such that the resulting expression will remain relatively constant given an appropriate choice of the voltage parameter $V_D$. Consequently, the bandwidth $\Omega_0$ of PLL 24 will remain substantially constant even though power supply voltage, temperature and silicon manufacturing process tolerances vary.

Returning now to FIG. 2, a charge pump current generator 44 is provided in accordance with the invention and is configured to provide a charge pump current $I_{CP}$ to the charge pump 32. The precision charge pump current generator 44 is further connected to receive the VCO control voltage $V_C$ as a voltage source, and suitably comprises a resistor $R_2$ across which, in cooperation with the VCO control voltage $V_C$, the precision charge pump current $I_{CP}$ is developed.

Figure 3:
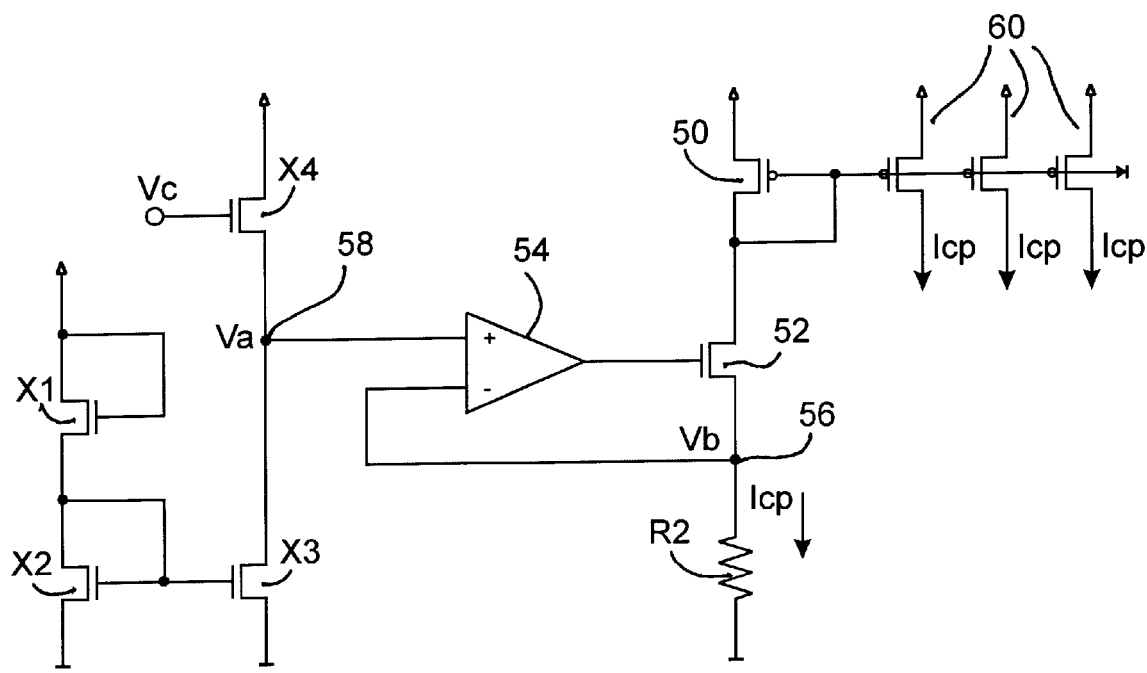
FIG. 3 is a semi-schematic circuit diagram of a precision charge pump current generator in accordance with the present invention.

Turning now to FIG. 3, there is depicted a semi-schematic circuit diagram of a precision charge pump current generating circuit suitable for practice of principles of the present invention. Briefly, the charge pump current generator, indicated generally at 44, comprises a current leg in which a dynamically varying precision charge pump current $I_{CP}$ is developed and a voltage bias leg in which the expression $(V_C - V_D)$ is developed and which conditions the charge pump current path to adaptively vary the charge pump current $I_{CP}$ as an inverse function of $V_C$.

Specifically, the charge pump current path suitably comprises a P-channel transistor current source 50 which develops the charge pump current $I_{CP}$. The $I_{CP}$ current path is directed through an N-channel transistor 52, gate-controlled by an operational amplifier (op-amp) 54 whose inverting input is source-connected to the N-channel transistor 52 to thereby maintain the connection node to the operational amplifier 54 at a particular voltage equal to a voltage applied to its non-inverting input, by adjusting the gate voltage on N-channel transistor 52. The charge pump current $I_{CP}$ is further directed through a resistor $R_2$ to a $V_{SS}$ power supply, thereby developing an IR drop voltage at connection node 56 which, as will be seen subsequently, equates to $V_B$. As mentioned earlier, connection node 56 is coupled to the inverting input of the operational amplifier 54 whose non-inverting input is coupled to a second connection node 58 which, in turn, defines the expression $(V_C-V_D)$. Accordingly, it will be understood that operational amplifier 54 in combination with N-channel transistor 52 operates to maintain connection node 56 at the same potential (voltage level) as connection node 58. Accordingly, in a manner that will be described in greater detail below, as the VCO control voltage $V_C$ varies with VCO gain, the voltage on connection node 58 will vary in a corresponding manner. Operational amplifier 54, in response, compares the $(V_C-V_D)$ potential at node 58 with the $(V_B)$ potential at node 56, and adjusts the gate voltage on N-channel transistor 52 to thereby vary the amount of charge pump current directed through the transistor, and thus dropped across resistor $R_2$, so as to adaptively adjust connection node 56 $(V_B)$ to the same potential as connection node 58. Thus, charge pump current is adaptively and dynamically varied as a function of variations in the control voltage $V_C$ provided to the voltage control oscillator of a PLL.

It should be mentioned, here, that the charge pump current provided to, for example, charge pump 32 of FIG. 2, is developed by a P-channel current mirror 60 coupled to the P-channel current source 50 comprising the generator circuit 44. It should also be noted, here, that a multiplicity of P-channel current mirrors may be provided, each of which may be a current source for a multiplicity of charge pumps, and each of which mirrors the dynamically and adaptively varying charge pump current $I_{CP}$ developed in the generating circuit 44.

As to the voltage bias portion of generator circuit 44, it will be seen to comprise a pair of N-channel transistors denoted herein as X1 and X2, connected together in series-fashion between $V_{DD}$ and $V_{SS}$ and each configured as an active resistor, with their gate terminals connected in common with their respective drains. The gate terminal of N-channel transistor X2 is further connected in common with the gate of an N-channel current mirror transistor, denoted herein as X3. As can be seen from the illustrated embodiment of FIG. 3, the drain of the current mirror N-channel X3 defines node 58 which is coupled, in turn, to the non-inverting input of the operational amplifier 54. Node 58 further defines the source terminal of an N-channel transistor, denoted herein as X4, the drain of which is connected to a power supply voltage $V_{DD}$ and which is operatively responsive to the VCO control voltage $V_C$ which is directed to its gate terminal.

In operation, it will be understood by those having skill in the art of MOS circuit design, that the N-channel transistors X1 and X2, configured as active resistors, function to develop a voltage $V_{GS}$ on the gate terminal of N-channel current mirror transistor X3. The magnitude of $V_{GS}$ will be understood to be a function of the ratio of the $V_{DS}$ drops across internal transistors X1 and X2 which is, in turn, a function of the currents ($I_{DS1}$ and $I_{DS2}$) therethrough which may also be defined in terms of each transistor's geometry or W/L ratio. Thus, the active resistor pair X1 and X2, in effect a voltage divider, impresses a gate voltage $V_{GS}$ on the mirror transistor X3. In accordance with well known principles, the $I_{DS}$ current through N-channel mirror transistor X3 is a function of its $V_{GS}$ which is in turn a function of the geometric ratios of X1 and X2 as described above. The well known relationship between $I_{DS}$ and $V_{GS}$ is expressed as follows:

$$I_{DS}=K'(W/L)(V_{GS}-V_T)^2$$

Although it is not always a precise assumption, for purposes of this analysis it will be assumed that the voltage and mobility expressions $(V_{GS}-V_T)^2$ and K' are reasonably constant, at least for generally similarly sized transistors which are constructed in close proximity to one another in a silicon integrated circuit. Consequently, the IDS ratios of the various transistors comprising the voltage bias portion of the generation circuit 44 may be expressed in terms of their geometries or W/L ratios. For purposes of ease of calculation, the W/L ratio for a particular transistor will be denoted herein as $X_n$, where n indicates the particular transistor of interest. It is for this reason, matching particular transistors in the embodiment of FIG. 3 to their geometric expression $X_n$, that the transistors of the voltage bias portion of the generation circuit 44 have been denoted as X1, X2, X3 and X4.

Fundamentally, $V_{DS4}$ depends on the geometry of transistor X4 and the current $I_{DS4}$ through it. Kirkoff's Law, however, requires that $I_{DS4}$ equal $I_{DS3}$. From the foregoing analysis, it will be understood that a voltage $V_A$ will be developed at connection node 58 which is equal to the quantity $(V_C-V_D)$ where $V_D$ may be expressed by the quantity:

$$V_D = V_T \left[ \sqrt{\frac{X_1 X_3}{X_2 X_4}} \cdot \frac{V_{DD} - 2V_T}{1 + \sqrt{X_1/X_2}} \right]$$

In the foregoing expression, $V_T$ is the designed threshold voltage of an N-channel transistor as defined by the particular CMOS silicon manufacturing process chosen to fabricate the subject circuit. Likewise, $V_{DD}$ is the power supply voltage to which the circuit is coupled, while X1, X2, X3 and X4 are defined by the transistor geometries (the W/L ratios). In a manner to be described in greater detail below, an appropriate choice of X1, X2, X3 and X4 will ensure that the voltage $V_A$ at connection node 58 $(V_C-V_D)$ will vary in a suitably in proportional manner to VCO gain $K_{VCO}$ such that the gain voltage product, $K_{VCO}(V_C-V_D)$ will remain relatively constant. In this regard, op-amp 54 functions to reflect the voltage value $V_A$ at connection node 58 to connection node 56 as $V_B$ by adaptively and dynamically varying the amount of current $I_{CP}$ which is conducted through the N-channel transistor 52. The stability of the voltage at connection node 56 is ensured by the resistor $R_2$, which as described above, is fabricated in close proximity to the resistor $R_1$ comprising the analog filter 40 of FIG. 2. Accordingly, any variation in resistor $R_2$ will be reflected in resistor $R_1$. Moreover, any such variations will have the effect of varying the voltage $V_B$ at connection node 56 which will cause the operational amplifier 54 to increase or decrease $I_{CP}$ to compensate. The $I_{CP}$ current sourced through the P-channel transistor 50 is reflected to the P-channel current mirror transistor 60 whence it is directed by charge pump circuit 32 of FIG. 2 to the resistor $R_1$ of the analog filter 40.

In accordance with practice of principles of the invention, it is clear that $I_{CP}$ is dynamically and adaptively adjusted so as to maintain the voltage $V_B$ at connection node 56 equal to the voltage $V_A$ at connection node 58. Moreover, it will be clear that the voltage $V_A$ is equal to $(V_C-V_D)$ where $V_C$ is the VCO control voltage and $V_D$ is a function of suitably determinable design and power supply parameters and the W/L geometric ratios of the transistors comprising the voltage bias portion of the generation circuit 44 of FIG. 3.

Figure 4:
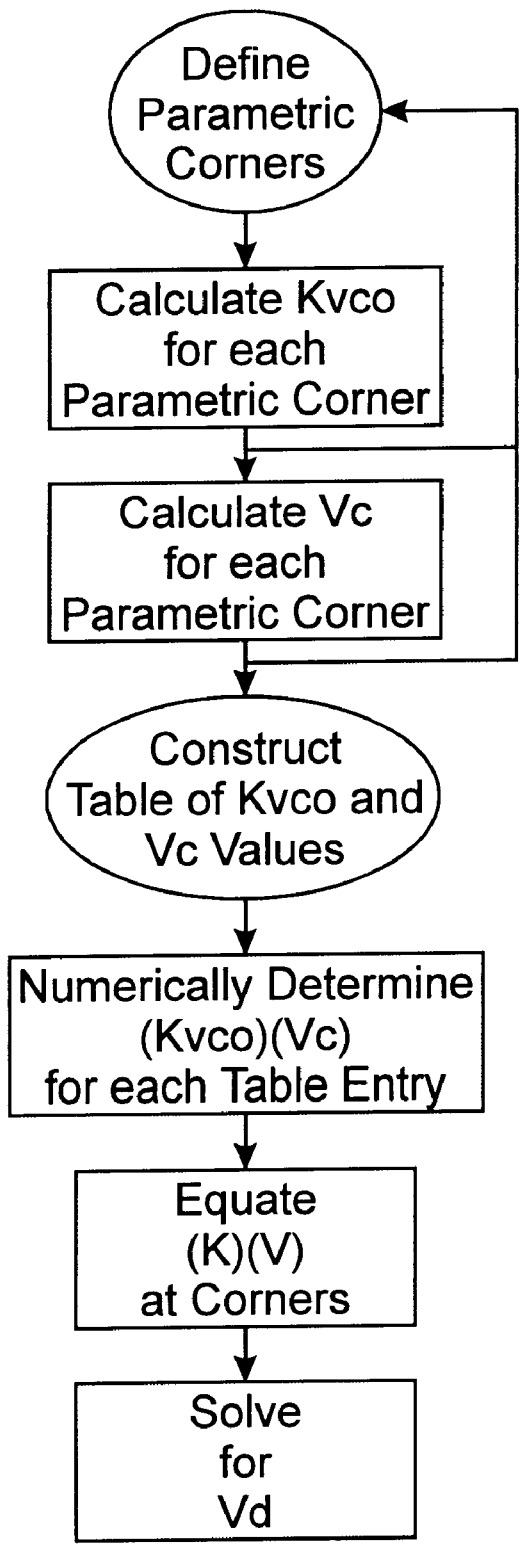
FIG. 4 is a simplified flow diagram of a method of calculating bias transistor characteristics in accordance with practice of principles of the present invention.

Turning now to FIG. 4, there is depicted an exemplary flow diagram of a method and system for determining suitable values of transistor geometries (X1, X2, X3 and X4), such that $V_D$ is definable and the expression $K_{VCO}(V_C-V_D)$ will be relatively constant.

In accordance with practice of the present invention, the first step of the method involves defining the parametric corners of the particular silicon manufacturing process being used to implement the circuit. Defining the parametric corners, in practical terms, means determining the three sigma (σ) values for sheet resistance, oxide thicknesses, photolithographic line width variations, in effect, the tolerance range of various semiconductor manufacturing process steps which have an impact on integrated circuit performance.

Once the parametric corners are defined, a circuit designer is able to calculate, in accordance with various conventional circuit modeling techniques, values for VCO gain $K_{VCO}$ and the control voltage $V_C$ at each of the excursion corners for a particular process parametric set. This involves setting up and running AC simulations of the circuit using one of the modern analogs of the well-known SPICE simulation routine, for example, with the various electrical parameters being varied over their tolerance ranges. In accordance with the invention, a circuit designer is then able to construct a table containing entries for $K_{VCO}$ and $V_C$ as they were determined (calculated by the simulation routine) at each of the parametric excursion corners. From this table, a gain voltage product ($K_{VCO} V_C$) may be determined for each of the calculated parametric points.

As discussed above, it is important that the quantity $K_{VCO}$ ($V_C$-$V_D$) be constant over substantially all of the manufacturing processes parametric space. Thus, the $K_{VCO}$ ($V_C$-$V_D$) for one point in the parametric space is equated to the $K_{VCO}$ ($V_C$-$V_D$) function at a second, preferably opposite, point in the parametric space in accordance with the following expression:

$$K_{VCO_1}(V_{C_1}-V_D) = K_{VCO_2}(V_{C_2}-V_D)$$

Solving for $V_D$ and rearranging terms gives $$V_D \left( \frac{K_{VCO_1} V_{C_1} - K_{VCO_2} V_{C_2}}{K_{VCO_1} - K_{VCO_2}} \right)$$

where the individual $K_{VCO}$ and $V_C$ values may be substituted with their numerical values extracted from the earlier constructed table. Thus, $V_D$ is numerically determinable.

Once a numeric value is defined for $V_D$, numeric values may be determined for X1, X2, X3 and X4 by a simple substitution into the equation for $V_D$. In this regard, the threshold voltage $V_T$ is easily definable as a function of the particular silicon manufacturing process being used to implement the circuit. In addition, $V_{DD}$ is a defined power supply voltage and typically is not allowed to vary in absolute magnitude by more than +/-10%. Thus, the only remaining unknown terms in the $V_D$ equation are those which relate to the transistor geometries, X1, X2, X3 and X4.

The process may be simplified even further, if the transistors comprising the active resistors (X1 and X2) are constructed with the same geometries. Accordingly, the X1 and X2 terms cancel out of the $V_D$ expression and the resulting expression may be give by:

$$V_D = V_T + \sqrt{\frac{X_3}{X_4}} \left( \frac{V_{DD} - 2V_T}{2} \right)$$

As will be apparent from the relationships described above, the transistor geometric sizes $X_1$, $X_2$, $X_3$ and $X_4$ are expressed as ratios and not as absolute values. Accordingly, the specific widths and lengths of the individual transistors are not material to the proper functioning of the circuit, but, as will be understood by those having skill in the art are constrained somewhat. Specifically, if the transistor sizes are made too small, variations in the semiconductor manufacturing process tolerances will have a proportionately large effect on each transistor. In contrast, if the transistors are manufactured too large, valuable silicon real estate will be taken up by the circuit. Preferably, the transistors comprising the bias portion of the circuit, i.e., $X_1$, $X_2$, $X_3$ and $X_4$, are fabricated with transistor lengths (L) of approximately 2.0 microns and with widths (W) in a range of from about 10 to about 50 microns. Thus, it will be understood that numerical values for $X_1$, $X_2$, $X_3$ and $X_4$ will be in the range of from about 5 to about 25.

The above-described precision charge pump generation circuit is fabricated in a semiconductor technology, conventionally denoted as 0.35 micron CMOS, which provides N and P-type semiconductor regions with geometries and resistivities such that the filter resistor $R_1$ is approximately 1 KOhm, resistor $R_2$ is approximately 8 KOhms, $V_C$ is approximately 1.3 volts, $V_D$ is approximately 0.7 volts, and the $V_{CO}$ gain ($K_{VCO}$) is approximately 1 GHz/V. When the PLL is constructed with component parts comprising the above described values, and in accordance with the present invention, the PLL bandwidth ($\Omega_0$) will be approximately 2.5 MHz. Moreover, such a circuit has been fabricated and the observed PLL bandwidth varies according to a 1:1.25 ratio, in contrast to the 1:8 bandwidth variation ratio of a conventional PLL circuit.

A high-speed phase lock loop circuit has been described that includes a precision charge pump current generation circuit which dynamically and adaptively adjusts the PLL bandwidth by dynamically adjusting the charge pump current directed to the charge pump and, thus, across a resistor in an analog filter component. The charge pump current is dynamically adjusted in operative response to a VCO control voltage ($V_C$) so as to develop an inverse proportionality between charge pump current and VCO gain, thus stabilizing PLL bandwidth.

While the invention has been described in terms of a CMOS integrated circuit technology, it will be evident to one having skill in the art that the invention may likewise be suitably implemented in other semiconductor technologies, such as bipolar, bi-CMOS, and the like. Moreover, the circuit according to the invention may be constructed from discrete components as opposed to a monolithic integrated circuit. Thus, there has been brought to the art of high-speed phase locked loops an improved system and method for controlling bandwidth to a substantially constant value to ensure synchronization of an asynchronous data stream over varying environmental conditions. It will be recognized by those skilled in the art that various modifications may be made to the preferred and other embodiments of the invention described above, without departing from the broad inventive scope thereof. It will be understood, therefore, that the invention is not limited to the particular embodiments, arrangements or steps disclosed, but is rather intended to cover any changes, adaptations or modifications which are within the scope and spirit of the invention as defined by the appended claims.

I claim:

1. A phase lock loop of the type adapted to provide a timing reference in the gigahertz range for synchronizing to an asynchronous serial data stream, the phase lock loop comprising:

detector means for comparing a phase characteristic of a serial data stream to a phase characteristic of the timing reference, the detector means further for outputting control signals corresponding to a detected difference between said phase characteristics;

a charge pump connected to receive control signals from the detector means, the charge pump sourcing and sinking a variable characteristic current in response to said control signals;

a filter, including a first resistor for developing an oscillator control voltage in response to current sourced or sunk by the charge pump;

a voltage controlled oscillator defining an operational frequency operatively responsive to the control voltage for generating the timing reference, the voltage controlled oscillator further having a characteristic gain, whereby a bandwidth of the phase lock loop is a function of the oscillator gain, the variable characteristic current and the filter resistor; and charge pump current generation means for defining the variable characteristic current, the charge pump current generation means coupled to the control voltage and generating the variable characteristic current in response thereto, the charge pump current generation means providing the variable characteristic current to the charge pump, wherein the characteristic current is dynamically variable in inverse proportionality to the oscillator gain such that the phase lock loop bandwidth is maintained at a substantially constant value.

2. The phase lock loop according to claim 1, charge pump current generation means further comprising:

a second resistor configured to develop the dynamically variable characteristic charge pump current therethrough in response to a bias voltage applied thereacross; and voltage generating means for developing the voltage applied across the second resistor, the bias voltage developed from and variable in proportional response to the oscillator control voltage.

3. The phase lock loop according to claim 2, wherein the variable characteristic current varies in an inverse response relationship to a variation in the oscillator control voltage such that the variable characteristic current is represented as a function of a ratio of the first and second resistors and the bias voltage.

4. The phase lock loop according to claim 3, wherein the first and second resistors are semiconductor resistors constructed in proximity with one another and as a ratioed pair, such that the ratio of the first resistor to the second resistor remains fixed over variations of temperature and semiconductor manufacturing process tolerances.

5. The phase lock loop according to claim 4, wherein the variable characteristic current developed by the charge pump current generation means is sourced and sunk across the first resistor so as to define the oscillator control voltage.

6. In a phase lock loop of the type adapted to provide a timing reference in the gigahertz range for synchronizing to an asynchronous serial data stream, the phase lock loop including detector means for comparing a phase characteristic of a serial data stream to a phase characteristic of the timing reference, the detector means further for outputting pump-up and pump-down signals to a charge pump in response to a detected difference between said phase characteristics, the charge pump sourcing and sinking a variable characteristic current to a filter capacitor and across a first resistor to thereby develop an oscillator control voltage for controlling an operational frequency of a voltage controlled oscillator for generating the time reference, a charge pump current generation circuit for defining the variable characteristic current sourced and sunk by the charge pump, the charge pump current generation circuit comprising:

a bias voltage generation portion connected to receive the oscillator control voltage as an input, the bias portion developing a variable bias voltage representing a first order function of the control voltage; and a variable current generation portion operatively responsive to the bias voltage for generating the variable characteristic current having a magnitude variable in inverse proportionality to the oscillator control voltage such that phase lock loop bandwidth is maintained in a substantially constant condition.

7. The circuit according to claim 6, the variable current generation portion further comprising:

a current source;

a second resistor connected in series fashion to the current source; and voltage bias means connected between the current source and the second resistor, the bias means for providing the variable bias voltage across the second resistor so as to define the variable characteristic current therethrough.

8. The circuit according to claim 7, the bias voltage generation portion comprising a bias network, the bias network defining a numerically determinable adjustment voltage, the bias network additively combining the adjustment voltage to the oscillator control voltage to define the variable bias voltage.

9. The circuit according to claim 8, the voltage bias means comprising a voltage follower connected to the bias voltage generation portion and reflecting the variable bias voltage defined thereby to the current generation portion.

10. The circuit according to claim 9, wherein the voltage follower comprises an operational amplifier connected to control a gate terminal of an N-channel transistor configured as a source follower, the operational amplifier and transistor, in combination, maintaining the bias voltage defined by the voltage generation portion at a source terminal of the transistor.

11. The circuit according to claim 10, wherein the bias network defines a numerically determinable adjustment voltage, such that when additively combined with the oscillator control voltage, the resulting bias voltage varies in inverse proportionality to the oscillator gain.

12. The circuit according to claim 11, wherein the product of the gain times the bias voltage is substantially constant.

13. The circuit according to claim 12, wherein the bias network comprises transistors and wherein numerical definition of the adjustment voltage is a function of the geometrical ratios of the characteristic lengths and widths of the transistors.

14. The circuit according to claim 13, wherein the transistors are N-channel transistors.

15. The circuit according to claim 14, wherein the variable characteristic current varies in an inverse response relationship to a variation in the oscillator control voltage such that the variable characteristic current is represented as a function of a ratio of the first and second resistors and the variable bias voltage.

16. The circuit according to claim 15, wherein the first and second resistors are semiconductor resistors constructed in proximity with one another and as a ratioed pair, such that the ratio of the first resistor to the second resistor remains fixed over variations of temperature and semiconductor manufacturing process tolerances.

17. The circuit according to claim 16, wherein the variable characteristic current developed by the charge pump current generation circuit is sourced and sunk across the first resistor so as to define the oscillator control voltage.

* * * * *